United States Patent
Li et al.

(10) Patent No.: US 8,791,730 B2
(45) Date of Patent: Jul. 29, 2014

(54) SYNCHRONIZATION METHOD FOR CURRENT DIFFERENTIAL PROTECTION

(75) Inventors: Youyi Li, Beijing (CN); Bin Su, Beijing (CN); Ying Yang, Beijing (CN); Torbjorn Einarsson, Vasteras (SE); Zoran Gajic, Vasteras (SE)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 13/876,320

(22) PCT Filed: Nov. 9, 2010

(86) PCT No.: PCT/CN2010/078562
§ 371 (c)(1),
(2), (4) Date: Mar. 27, 2013

(87) PCT Pub. No.: WO2012/061978
PCT Pub. Date: May 18, 2012

(65) Prior Publication Data
US 2013/0181755 A1    Jul. 18, 2013

(51) Int. Cl.
*H03L 7/00*    (2006.01)

(52) U.S. Cl.
USPC .......... 327/141; 361/68; 361/69; 375/224

(58) Field of Classification Search
USPC .......... 327/141, 142; 375/224; 361/68, 69
See application file for complete search history.

(56) References Cited

U.S. PATENT DOCUMENTS

| 6,915,219 B2* | 7/2005 | Premerlani ............ 702/58 |
| 7,126,800 B2* | 10/2006 | Premerlani et al. ......... 361/68 |
| 7,480,580 B2* | 1/2009 | Zweigle et al. ............ 702/106 |
| 2005/0036254 A1* | 2/2005 | Premerlani et al. ......... 361/69 |
| 2012/0147941 A1* | 6/2012 | Su et al. ............. 375/224 |
| 2012/0224618 A1* | 9/2012 | Behzad et al. ........... 375/224 |
| 2013/0181755 A1* | 7/2013 | Li et al. ............. 327/156 |
| 2013/0301688 A1* | 11/2013 | Khandani ............ 375/211 |
| 2013/0338954 A1* | 12/2013 | Seki .............. 702/75 |
| 2014/0044158 A1* | 2/2014 | Raghu et al. ........... 375/224 |

FOREIGN PATENT DOCUMENTS

| CN | 101075754 A | 11/2007 |
| WO | WO2009147078 A1 | 12/2009 |

OTHER PUBLICATIONS

The State Intellectual Property Office, P.R. China, International Search Report re International Application No. PCT/CN2010/078562, dated Nov. 9, 2010.

* cited by examiner

*Primary Examiner* — Adam Houston
(74) *Attorney, Agent, or Firm* — Anthony M. Del Zoppo, III; Driggs, Hogg, Daugherty & Del Zoppo Co., LPA

(57) ABSTRACT

A synchronization method for current differential protection comprises: selecting a point on the transmission line protected by the current differential protection; measuring the current and the voltage of each of the terminals of said transmission line; calculating the compensating voltage at the selected point respectively according to the measured current and the voltage of the each terminal; detecting and calculating the synchronization error by comparing all the compensating voltages.

9 Claims, 5 Drawing Sheets

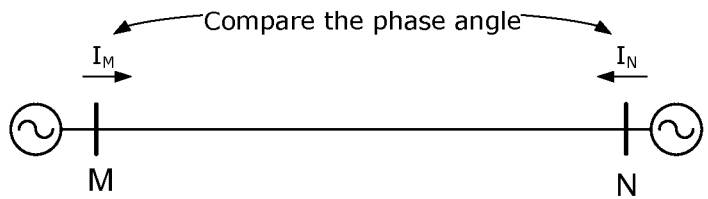
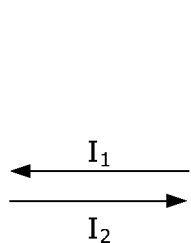
Fig. 2A
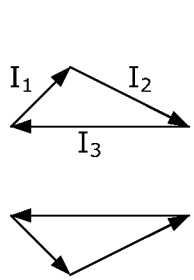
Fig. 2B
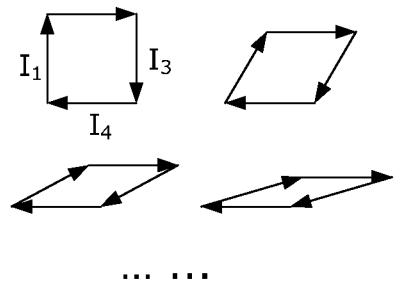
Fig. 2C
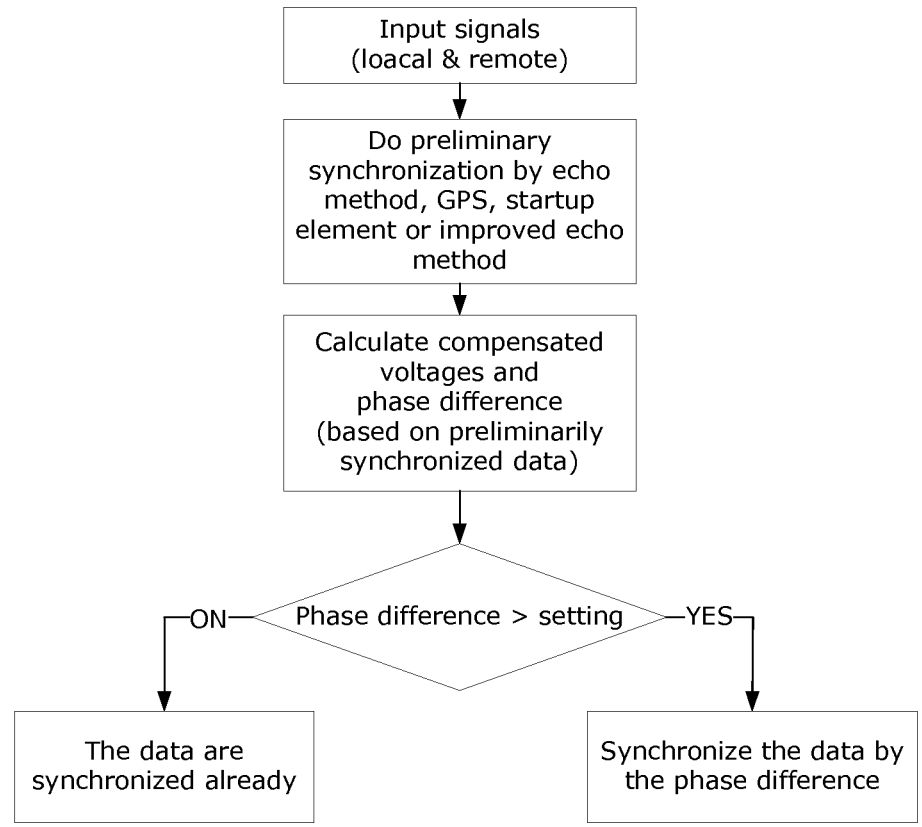
Fig. 3

SYNCHRONIZATION METHOD FOR CURRENT DIFFERENTIAL PROTECTION

RELATED APPLICATION

This application is a national filing of PCT application Serial No. PCT/CN2010/078562, filed Nov. 9, 2010.

FIELD OF THE INVENTION

This invention relates to the field of power system, and more particularly to a synchronization method used for current differential protection.

BACKGROUND OF THE INVENTION

Data synchronization is very important for the applications in power system, especially for current differential protection. Some external synchronization mechanism such as echo method or GPS is used widely by the protection system to ensure the data synchronization in practical applications. However, the reliability of echo method depends on the symmetry of communication channels and it is not always symmetrical in practical. And the signal of GPS is not always reliable enough. It will influence the reliability of current differential protection markedly and even may cause maloperation in some conditions.

The main problem of existing echo method is that its operation is severely affected by the channel symmetry status. Along with the development and improvement of modern power communication network, self-healing ring network or optical fiber channel with variable routing is gradually increasing. It causes new problems to optical fiber current differential protection for transmission lines. Existing data synchronization method assumes that the time latency of both sending and receiving channels are the same. Thus once the asymmetrical channel switching, the delays of sending and receiving channels are no longer equal, and thus the reliability of protection devices will be affected due to the data out of synchronization.

The main problem of synchronization by GPS is that GPS signal and device is not reliable enough to meet the requirement of protection system in practical, although GPS can provide accurate, absolute and synchronized time for all substations theoretically.

To overcome the problems of the existing external synchronization methods (echo method and GPS method), some patents such as CN101651324A, JP8037724A, JP2008125251 and JP2007068325, have disclosed methods based on load current instead of external synchronization mechanism. Although these patents have different specific embodiments, their basic principle can be described as following.

See FIG. 1, the methods in above mentioned patents are based on the fact that the measured load current vectors from the two terminals should be the same (same amplitude and reverse phase) in normal operation status. If the current phase difference measured from the two terminals are not reverse (180°), it means the data synchronization is wrong, and the phase difference from 180° can be used to synchronize the measurements. This principle can also be implemented by comparing the wave shift of the two load current waves.

This method is based on the measured currents instead of echo message or GPS signals. Thus, it will not be affect by channel asymmetry or reliability of GPS in principle. But phase angle of load currents in light load or no load conditions cannot be measured accurately. Thus, the load current based synchronization method cannot deal with light load or no load conditions.

And another shortcoming of this method is that it can only deal with two-terminal transmission line and cannot synchronize the measurements for the transmission line with more than two terminals.

As shown in FIG. 2, for two-terminal system, since the phase angles of the two load current vectors should be the reverse, there is only one choice to decide the phase difference between the two currents. Thus, accurate synchronization for two-terminal system can be finished. But for three-terminal system, it has two choices for the relative phase difference among the three current vectors. And for four-terminal or more terminal systems, there are even countless choices for the phase angle. Thus, the unique relative angle difference among these vectors cannot be determined. That means the measurements for the transmission line with more than two terminals by the said load current based synchronization method cannot be synchronized.

And in addition, these patens based on load currents have not considered the problem of more than half cycle synchronization error. Because the load current is periodical wave, if the synchronization error may be bigger than half cycle, the synchronization method cannot decide which direction is the right one for correcting the error.

In summation, for all the methods in above mentioned patents, although existing load current based synchronization method will not be influenced by asymmetrical channels, they cannot deal with light load or no load conditions, cannot deal with transmission lines with more than two terminals, and cannot deal with more than half cycle synchronization error.

Our previous patent application PCT/CN2009/076347 disclosed a method and apparatus for detecting communication channel delay asymmetry between transmission line protection devices. The method comprises: calculating, repeatedly, clock disparity between clocks of the protection devices and communication delays at different paths of the communication channel; comparing the latest calculated clock disparity and communication delays with previously calculated clock disparities and communication delays, respectively; determining a channel switching has happened if a change of the calculated clock disparity exceeds a first threshold, or a change of the calculated communication delays for any path exceeds a second threshold; and determining the channel delays as asymmetrical if a difference between the calculated communication delays of the different paths after the channel switching exceeds a third threshold. The improved echo method is based on the characteristic of echo method and local clocks instead of measurements. Thus, it can deal with the problems of asymmetrical channel switching including the cases of >½ cycle synchronization errors. However, the improved echo method may have the problem of accumulative error if there is lots of channel switching.

SUMMARY OF THE INVENTION

To overcome above mentioned shortcomings, the present invention provides a synchronization method for current differential protection.

The synchronization method for current differential protection according to the present invention comprises the following steps: selecting a point on the transmission line protected by the current differential protection; measuring the current and the voltage of each of the terminals of said transmission line; calculating the compensating voltage at the selected point respectively according to the measured current and the voltage of the each terminal; detecting and calculating the synchronization error by comparing all the compensating voltages.

According to one preferred embodiment of the present invention, the current and voltage of each of the terminals are measured before a fault.

According to the other preferred embodiment of the present invention, the current and voltage of each of the terminals are measured after a fault.

According to one preferred embodiment, the current and voltage of each of the terminals are vectors.

According to another preferred embodiment, the current and voltage of each of the terminals are sampling values.

According to one preferred embodiment, the current and voltage of each of the terminals are phase quantities.

According to another preferred embodiment, the current and voltage of each of the terminals are sequence quantities.

The point can be selected from any points of transmission line, according to one preferred embodiment, the point is selected preferably from the middle or the ends of the transmission line or the T connected point of the multi-terminal transmission lines. For a two-terminal transmission line, said point is selected from any points of transmission line, preferably the middle or the end of the transmission line; for a three-terminal transmission line, said point is selected from any points of transmission line, preferably the T connected point or the end of the transmission line; for a transmission line with more than three terminal, the transmission line is divided into two-terminal transmission lines, three-terminal transmission lines or their combination; said points are selected according to the method of two-terminal transmission line or three-terminal transmission line.

According to one preferred embodiment, the startup element method, echo method or improved echo method is used for a preliminary synchronization.

According to one preferred embodiment, synchronization method for current differential protection further comprises a following step: distinguishing the calculated synchronization error caused by a serious line parameter change or an asymmetrical channel switching by calculating the changing speed of the phase angle difference or the wave shift of said compensating voltage.

According to one preferred embodiment, if the current and voltage of each of the terminals are measured after a fault, the current and voltage are fault positive sequence components, negative sequence components, zero sequence components or a combination of some of them.

BRIEF DESCRIPTION OF THE DRAWINGS

The subject matter of the invention will be explained in more details in the following description with reference to preferred exemplary embodiments which are illustrated in the drawings, in which:

FIG. 1 is a schematic diagram which shows the synchronization method based on load currents;

FIG. 2A-2C are vector diagrams for load currents with different terminals; wherein, FIG. 2A is the vector diagram of two terminals, FIG. 2B is the vector diagram of three terminals, and FIG. 2C is the vector diagram of four terminals;

FIG. 3 is the conceptual flowchart of the first preferred embodiment;

FIG. 6A-6F are schematic diagrams of the compensation voltage based synchronization method; wherein FIG. 6A is the schematic diagrams of two-terminal transmission lines; FIG. 6B is the schematic diagrams of three-terminal transmission lines; FIG. 6C shows only one terminal is unsynchronized with others in three-terminal transmission lines; FIG. 6D shows all terminals are unsynchronized with others in three-terminal transmission lines; FIG. 6E shows the structure decomposition of multi-terminal transmission lines; FIG. 6F is the schematic diagrams of multi-terminal transmission lines;

DETAILED DESCRIPTION OF PREFERRED EMBODIMENTS

With reference to the above-mentioned figures, preferred embodiments of the present invention are provided.

The method of the present invention aims to synchronize the measurements for current differential protection even when the communication channel becomes asymmetrical or GPS signal is unreliable. It is based on compensated voltages instead of load currents so that it can deal with both heavy load and no load conditions. Furthermore, it can deal with the transmission line with more than two terminals.

The synchronization method for current differential protection according to the present invention comprises the following steps: selecting a point on the transmission line protected by the current differential protection; measuring the current and the voltage of each of the terminals of said transmission line; calculating the compensating voltage at the selected point respectively according to the measured current and the voltage of the each terminal; detecting and calculating the synchronization error by comparing all the compensating voltages.

Pre-Fault Embodiment

FIG. 3 is the conceptual flowchart of the first preferred embodiment. In this preferred embodiment, the current and voltage of each of the terminals are measured before a fault and the current and voltage of each of the terminals are vectors. The method of the current and voltage of each of the terminals in sampling values is also provided.

In the pre-fault status, the compensated voltages on the same certain point along the transmission line calculated from all terminals should be the same with each other. That means that if the voltage at the same point is calculated by the measurements from different terminals, these calculated (compensated) voltages should be the same, including the phase angle and wave shift. If the phases of compensated voltages are different from each other, it means the data synchronization (communication channel becomes asymmetrical or GPS signal becomes unreliable) is wrong. And the phase difference or wave shift between these compensated voltages can be employed to synchronize the measurements from different terminals.

Figure 4:
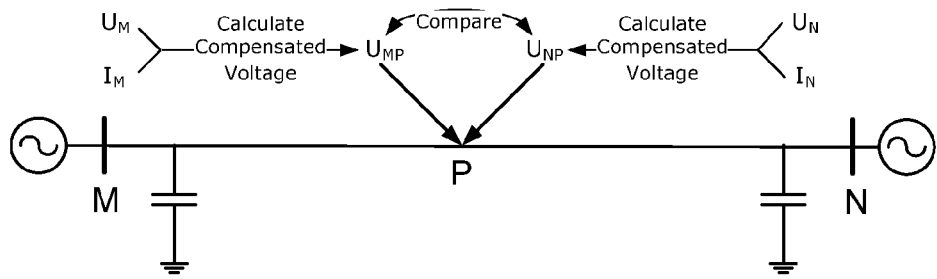
FIG. 4 is a schematic diagram of the compensation voltage based synchronization method of a two-terminal transmission line.

FIG. 4 shows a two-terminal transmission line. The following signals are measured during pre-fault state:

At the terminal M: $U_M$, $I_M$
At the terminal N: $U_N$, $I_N$

The measurements from the terminals can be used to calculate the compensated voltage at point P. Here, P can be any point of the transmission line (e.g. terminal M, N or the middle point). Use $U_M$, $I_M$ to calculate $U_{MP}$, and use $U_N$, $I_N$ to calculate $U_{NP}$. $U_{MP}$ and $U_{NP}$ are the voltages of the same point. Thus, they should be the same in theory if $U_M$, $I_M$ and $U_N$, $I_N$ are synchronized properly. And if $U_{MP}$ and $U_{NP}$ are different from each other, it means something wrong with data synchronization. And the difference can be used to compensate the data to make the measurements synchronized.

The proposed synchronization method is flexible about the types of system parameter and measurement quantities. That means the calculation can be based on lumped parameter or distributed parameter. And the calculation can be based on vector or sampling value.

Figures 5A, 5B:
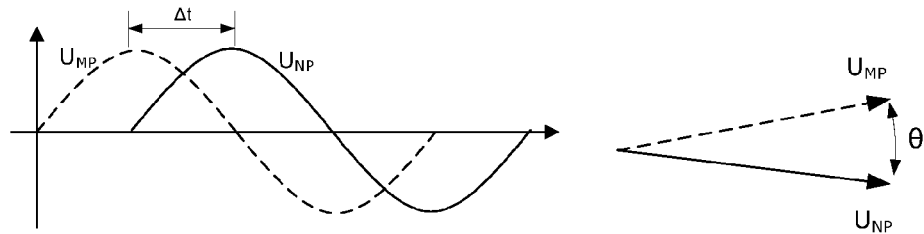
FIG. 5A-5B shows the relationship between the voltages of sampling data and vector forms.

FIG. 5A-5B show the relationship between the voltages of sampling data and vector forms. If the data from terminals M and N are unsynchronized, there will be a time shift $\Delta t$ between the two compensated voltages $U_{MP}$ and $U_{NP}$ as shown in FIG. 5A. And it can also be described in vector diagram in FIG. 5B. Here, $\theta=360°\times\Delta t\times f$, (f is the system frequency). The wave shift $\Delta t$ or phase difference $\theta$ is just the error of data synchronization between the measurements from terminals M ($U_M$, $I_M$) and N ($U_N$, $I_N$). And they can be employed to synchronize/compensate the unsynchronized data directly.

$\Delta t$ or $\theta$ can be calculated by vectors or sampling values as following:

1) Based on Vectors

In this preferred embodiment, the current and voltage are calculated based on lumped parameter and vector values.

Suppose P is the midpoint of the line, shunt capacitance is $Z_C$ and line impedance is $Z_L$.

$$U_{MP}=U_M-(I_M-U_M/Z_C)\times Z_L/2 \quad (1)$$

$$U_{NP}=U_N-(I_N-U_N/Z_C)\times Z_L/2 \quad (2)$$

$$\theta=\angle U_{MP}-\angle U_{NP} \quad (3)$$

$$\Delta t=\theta/f \quad (4)$$

Applying equations (1)~(4), the time difference $\Delta t$ or phase difference $\theta$ between the measurements from the two terminals can be determined and used to compensate the vector or sampling value directly as follows:

$$I'_N=I_N e^{j\theta} \quad (5)$$

$$i'_N(t)=i_N(t+\Delta t) \quad (6)$$

2) Based on Sampling Values

In another preferred embodiment, the current and voltage are calculated based on sampling values and Bergerons model.

$$u_+(t)=\frac{u(t)+i(t)\cdot Z_C}{2} \quad (7)$$

$$u_-(t)=\frac{u(t)-i(t)\cdot Z_C}{2} \quad (8)$$

$$u(x,t)=u_+\left(t-\frac{x}{v}\right)+u_-\left(t+\frac{x}{v}\right) \quad (9)$$

Wherein, u(x,t) is the compensated voltage (sampling value) at some certain point u(t), i(t) are measured voltage and current (sampling value) at terminals $Z_C$ is the surge impedance of the transmission line is the forward direction wave $u_+$ is the reverse direction wave v is the velocity of traveling wave Applying equations (7)~(9), the compensated voltage at any certain point along the line can be determined. Thus, assume x=L/2, the compensated voltage at the middle of the line can be calculated based on the measurements from the two terminals respectively as $u_{NP}(t)$ and $u_{NP}(t)$, the difference of the two compensated voltages can be employed to compute the time difference of the measurements from the two terminals by comparing $u_{MP}(t)$ and $u_{NP}(t)$.

The two compensated voltages can be compared by two methods:

1) Methods in time-domain;
2) Methods in frequency-domain;

Waveform matching, zero-cross or some other time-domain methods can be used to find the unsymmetrical time $\Delta t$ (time shift $\Delta t$ in FIG. 5A) from the sampling values directly.

And for frequency-domain methods, one can compute the power-frequency vectors of the compensated voltages and then calculate the phase difference ($\theta$ in FIG. 5B). And the phase difference can be used to synchronize the measurement data as shown below:

$$I'_N=I_N e^{j\theta} \quad (10)$$

$$i'_N(t)=i_N(t+\Delta t)$$

In the equation (7)~(9), all the voltages and currents are phase-phase modulus. It may be (A-B), (B-C) or (C-A).

The voltage at the compensated point may be very low if it's just at the power swing center, which will influence the accuracy and sensitivity of the synchronization method. And it's easy to select other compensated point to avoid this condition.

The advantages of sampling values based calculation method are shown as following:

1) Independent with vectors, impervious to non-sinusoidal waves;
2) Independent with low-pass filter or DFT, avoid corresponding errors;
3) Shunt capacitance is taken into account inherently;
4) It can work fine with both heavy and no load conditions;

In the cases with severe aberrance of current and voltage wave or fast power swing, it's difficult to get accurate current and voltage vectors. Thus, the vector based method may be difficult to perform accurate synchronization, while sampling value based method can still work well in these cases.

According to the other preferred embodiment, the synchronization method of the present invention for the multi-terminal transmission lines is provided.

Method for the Multi-Terminal Transmission Lines

1) Two-Terminal Transmission Lines

Figure 6A:
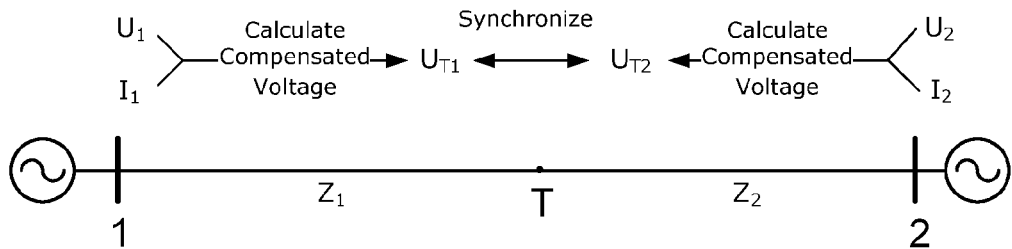

For two-terminal lines, the compensated point T for synchronization method can be any point along the line. It may be terminal 1, terminal 2, middle point or any other point between the two terminals. The synchronization process includes two steps as shown in FIG. 6A.

Calculate the compensated voltage at the T point by the measurements from the two terminals respectively (shunt capacitance is ignored in this case to simplify the analysis)

$$U_{T1}=U_1-I_1\times Z_1 \quad (12)$$

$$U_{T2}=U_2-I_2\times Z_2 \quad (13)$$

Calculate the phase difference between the two compensated voltages. And then use the phase difference to synchronize the measurements $$\theta=\angle U_{T2}-\angle U_{T1} \quad (14)$$

Figure 6B:
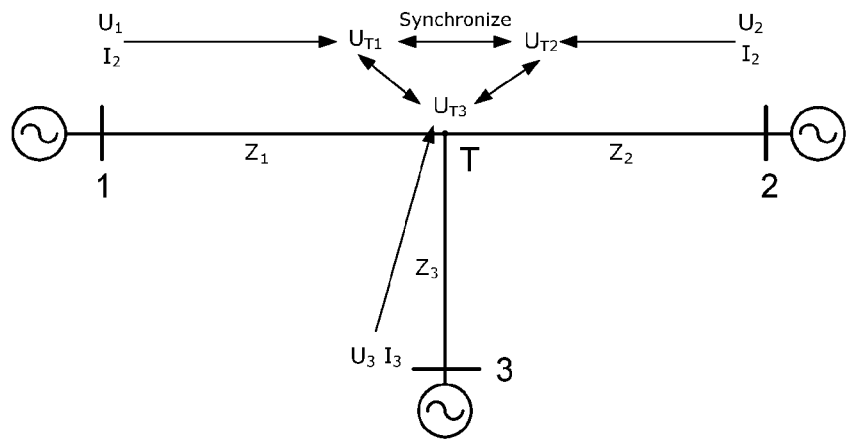

The final synchronized measurements are (select terminal 1 as reference):
Terminal 1:
Terminal 2: $U_2 e^{j\theta}$, $I_2 e^{j\theta}$ 2) Three-Terminal Transmission Lines Like two-terminal lines, the compensated point for synchronization method may be any point along the three-terminal lines in theory. But for convenience, the best choice for the compensated point is the T joint, as shown in FIG. 6B. The synchronization includes the following steps:

Calculate the three compensated voltages at the T point by the measurements from the three terminals respectively (shunt capacitance is ignored in this case to simplify the analysis)

$$U_{T1}=U_1-I_1\times Z_1 \quad (15)$$

$$U_{T2}=U_2-I_2\times Z_2 \quad (16)$$

$$U_{T3}=U_3-I_3\times Z_3 \quad (17)$$

Select any one compensated voltage as reference and then calculate the two phase differences between the reference voltage and the other two compensated voltages respectively. Use the two phase differences to synchronize the measurements from the two corresponding terminals $$\theta_1=\angle U_{T2}-\angle U_{T1} \quad (18)$$

$$\theta_2=\angle U_{T3}-\angle U_{T1} \quad (19)$$

The final synchronized measurements are (select terminal 1 as reference):
Terminal 1: $U_1$, $I_1$,
Terminal 2: $U_2 e^{j\theta_1}$, $I_2 e^{j\theta_1}$
Terminal 3: $U_3 e^{j\theta_2}$, $I_3 e^{j\theta_2}$ Any one compensated voltage can be selected as reference voltage, and no matter which and how many communication channels are asymmetrical, the proposed synchronization method can work fine. The differential protection only cares the relative synchronization error (time shift) between the terminals.

For the three-terminal system, it may have two possible unsynchronized conditions as shown below.

Figures 6C, 6D:
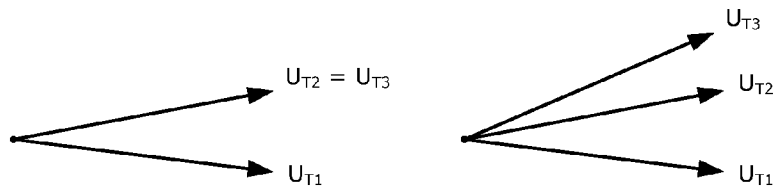

As shown in FIG. 6C, in some cases, two of the three measurements are still synchronized, only one is unsynchronized with others. In some other cases, as shown in FIG. 6D, the measurements from the three terminals are different from each other.

The proposed synchronization method can deal with both conditions well. For it just synchronizes all measurements by removing the relatively phase difference or time shift between these compensated voltages no matter which and how many measurements are unsynchronized. And it's the same with other multi-terminal line structures besides three-terminal line.

3) Multi-Terminal Transmission Lines

Figure 6E:
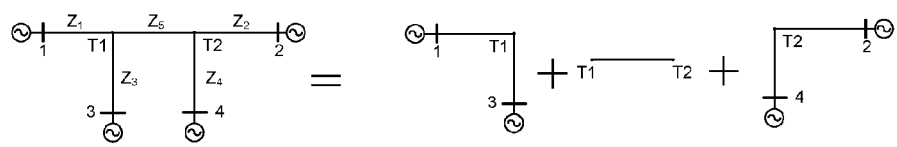
Figure 6F:
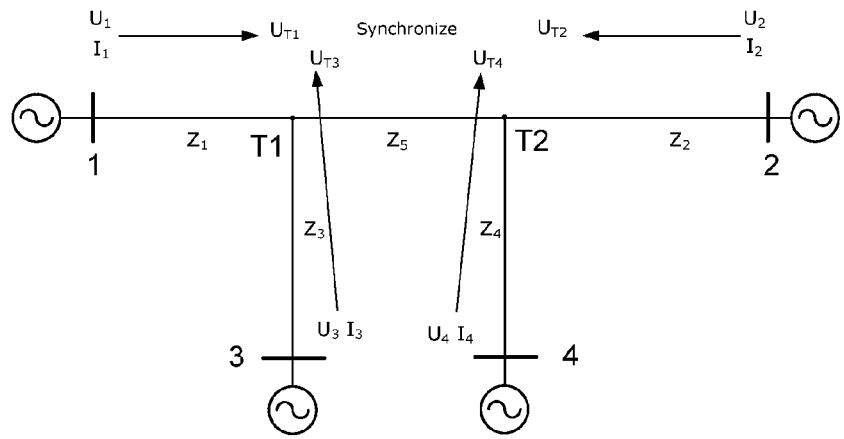

FIG. 6E shows the structure decomposition of multi-terminal transmission lines. FIG. 6F is the schematic diagrams of multi-terminal transmission lines. The synchronization steps include (shunt capacitance is ignored in this case to simplify the analysis):

Calculate the four compensated voltages $U_{T1}$ and $U_{T3}$ at $T_1$, $U_{T2}$ and $U_{T4}$ at $T_2$ by the measurements from the four terminals respectively $$U_{T1}=U_1-I_1\times Z_1 \quad (20)$$

$$U_{T1}=U_1-I_1\times Z_1 \quad (20)$$

$$U_{T2}=U_2-I_2\times Z_2 \quad (21)$$

$$U_{T3}=U_3-I_3\times Z_3 \quad (22)$$

$$U_{T4}=U_4-I_4\times Z_4 \quad (23)$$

Calculate the phase difference $\theta_1$ between $U_{T1}$ and $U_{T3}$, and then synchronize them. The synchronized currents and voltages are $U_1$, $I_1$, $U_3 e^{j\theta_1}$, $I_3 e^{j\theta_1}$ (select terminal 1 as reference).

Do the same synchronization process with terminal 2 and 4. Calculate the phase difference $\theta_2$ between $U_{T2}$ and $U_{T4}$, then, synchronize them. The synchronized currents and voltages are $U_2$, $I_2$, $U_4 e^{j\theta_2}$, $I_4 e^{j\theta_2}$ (select terminal 2 as reference).

$$\theta_1=\angle U_{T3}-\angle U_{T1} \quad (24)$$

$$\theta_2=\angle U_{T4}-\angle U_{T2} \quad (25)$$

Select any point between $T_1$ and $T_2$ as compensated point ($T_1$ is selected in this case). Calculate the compensated voltages with the synchronized data from step 2. Then, calculate the phase difference $\theta_2$ and synchronize the data again.

$$U'_{T1}=U_{T2}-(I_2+I_4 e^{j\theta_2})\times Z_5 \quad (26)$$

$$\theta_3=\angle U'_{T1}-\angle U_{T1} \quad (27)$$

The final synchronized measurements are (select terminal 1 as reference):
Terminal 1: $U_1$,
Terminal 2: $U_3 e^{j\theta_3}$, $I_3 e^{j\theta_3}$
Terminal 3: $U_2 e^{j\theta_1}$, $I_2 e^{j\theta_1}$
Terminal 4: $U_4 e^{j(\theta_2+\theta_3)}$, $I_4 e^{j(\theta_2+\theta_3)}$ According to another preferred embodiment, the echo method, improved echo method or startup element method is used for a preliminary synchronization. The preliminary synchronization ensures the synchronization method can deal with the big synchronization error which is even more than ½ cycle.

Figure 7:
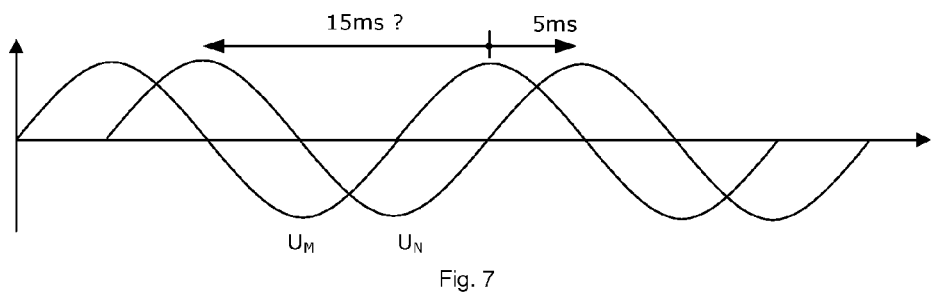
FIG. 7 shows the problem of more than ½ cycle error.

FIG. 7 shows the condition of more than ½ cycle error. $U_M$ and $U_N$ are the compensated voltages at the same point calculated by the measurements from terminal M and N respectively. If the synchronization error may be bigger than ½ cycle, the synchronization method cannot decide which direction is the right one for the wave shifting as the phase angle is periodical. For example, if the actual wave shift is 15 ms or 5 ms (50 Hz system), their calculated phase angles or wave shifts will be the same. The solution for this problem is to employ some other method to do preliminary firstly to make sure the error is less than ½ cycle and then use the proposed compensated voltage based method to do accurate synchronization.

1) Preliminary Synchronization Using Startup Element Method

The operation times of the two start-up elements at the two terminals can be used as the preliminary synchronization as shown below. And then the proposed synchronization method is used for accurate synchronization.

Figure 8:
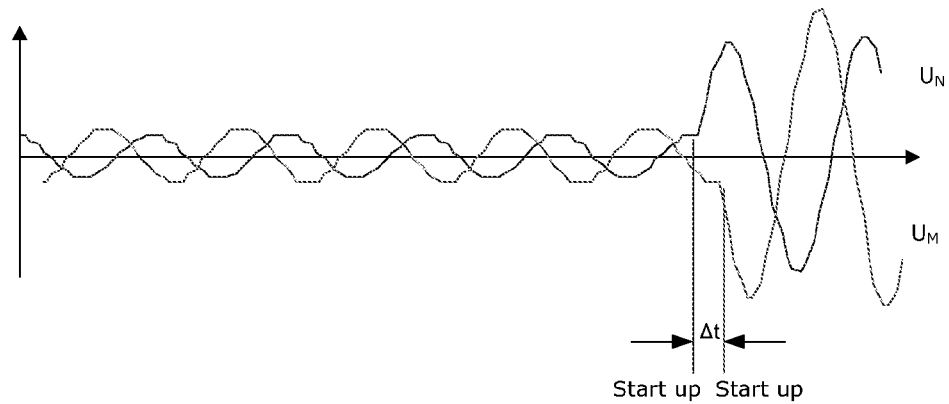
FIG. 8 shows the preliminary synchronization using startup element method.

As shown in the FIG. 8, if there is no data synchronization error and the two startup elements have the same operation speed, the difference of the two startup times Δt should be almost zero. And if practical Δt is not zero, it means something wrong with the synchronization error. Thus, Δt can be used for the preliminary synchronization.

Obviously, it's necessary that the time difference of the operation speeds of the start-up elements should be less than ½ cycle (10 ms for 50 Hz system) to make sure the preliminary synchronization is accurate enough.

2) Preliminary Synchronization Using Echo Method

The total delay of sending channel and receiving channel can be calculated accurately by echo method no matter the channels are symmetrical or asymmetrical.

$$t_{Total} = t_{sending} + t_{receiving} \quad (28)$$

If the calculated total delay of $t_{Total}$ is less than one cycle, the synchronization error of echo method is less than ½ cycle definitely. Thus, it can be confirmed that there is no problem of ½ cycle synchronization error for the method.

For example, one direction delay is 3 ms and the other is 16 ms, protection will use 9.5 ms as the channel delay to synchronize the data by echo method. And the final synchronization error $t_{error}$ is 6.5 ms which is less than ½ cycle as shown below.

$$t_{error} = \frac{t_{sending} + t_{receiving}}{2} - t_{receiving} = \frac{16+3}{2} - 3 = 6.5 \text{ ms}$$

3) Preliminary Synchronization Using Improved Echo Method

As disclosed in our previous patent application PCT/CN2009/076347, the improved echo method is based on the characteristic of echo method and local clocks instead of measurements. Thus, it can deal with the problems of asymmetrical channel switching including the cases of >½ cycle synchronization errors. Thus, one reasonable solution is that improved echo method and synchronization method base on compensated voltages can cooperate with each other. Do preliminary synchronization using improved echo method, and then use the said compensated voltage based method to do accurate synchronization.

According to the other preferred embodiment, the synchronization method of the present invention further comprises a step of distinguishing the calculated synchronization error caused by a serious line parameter change or an asymmetrical channel switching by calculating the changing speed of the phase angle difference or the wave shift of said compensating voltage.

Influence of Serious Parameter Change Like Ice-Coating

Line parameter is used in the calculation for the synchronization method. The line parameter error will influence the calculation result of synchronization error. The line parameter error is small in normal operation status. So that it will not cause any problem for proposed synchronization method in these normal conditions. But in some special cases such like serious ice-coating, the line length and parameter will change a lot and the line parameter error may exceed the limit. It may influence the synchronization result remarkably. Thereby, some method should to be employed to detect these conditions and block the output of synchronization method.

Figure 9:
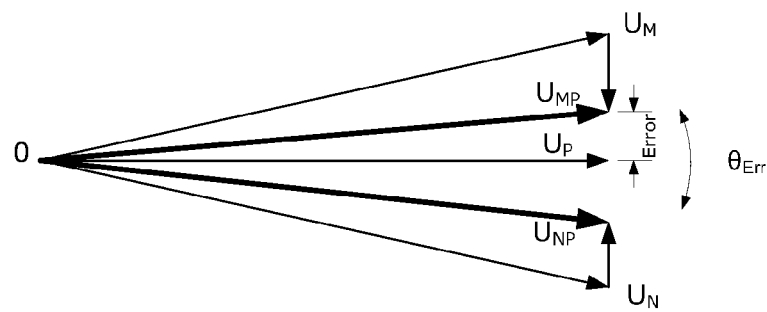
FIG. 9 shows the effect of line parameter error.

The corresponding vector diagram is as follows. FIG. 9 shows the effect of line parameter error, wherein $U_M$ and $U_N$ are the measured voltages at terminal M and N respectively.

$U_P$ is the actual voltage at compensation point. $U_{MP}$ and $U_{NP}$ are the compensated voltages calculated by the measurements from terminal M and N.

If there is no error, $U_P$, $U_{MP}$ and $U_{NP}$ should be the same. But because of the ice, the actual line length and impedance is bigger than that for synchronization calculation. Thus, the compensated points in the calculation from different terminals are no more the same and it causes the synchronization error $\theta_{Err}$.

The synchronization error $\theta_{Err}$ increases with the increase of power angle between the terminals M and N (∠$U_M$–$U_N$). It means that if the power angle is small (light load), the synchronization error is also small even with big parameter error.

Proposed synchronization method is based on the angle difference between the two compensated voltages at the same point. If the angle difference changes from zero to a relatively big value, it means something wrong with the data synchronization. But the problem is that both asymmetrical channel switching and serious parameter changing (e.g. ice) may cause the same angle difference. It brings us a problem to distinguish them.

The changing speeds by the two reasons are different obviously. For asymmetrical channel switching, it's a sudden change. The change process is less than several seconds or even faster.

But for serious line parameter error like ice-coating, it's a gradual change. The change process may be several hours or even several days. Thus, we can distinguish the two conditions by monitoring their change speeds as shown below.

Figure 10A:
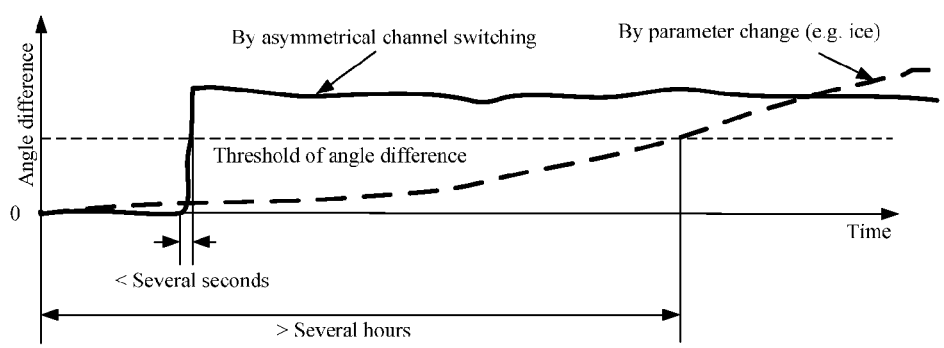
FIG. 10A shows the difference between asymmetrical channel switching and parameter changes.

FIG. 10A shows the difference between asymmetrical channel switching and parameter changes. The thick solid line and thick dotted line are the angle difference between the two compensated voltages at the same compensation point by asymmetrical channel switching and line parameter change respectively. Obviously, their change speeds are different.

In practical applications, only the sudden change of angle difference can be used by data synchronization. And if the gradual and big enough change is detected, it means line parameter changes a lot (by ice or other reasons) and proposed synchronization method should be blocked.

This principle can be implemented by different methods; a typical one is by difference method as shown below.

$$\Delta\theta = \theta(t) - \theta(t-T) \quad (29)$$

Here, θ is the angle difference of the two compensated voltages. And T is a time delay (e.g. several seconds). T should be bigger than the longest channel switching time for echo method and less than the shortest ice-coating process time.

Figure 10B:
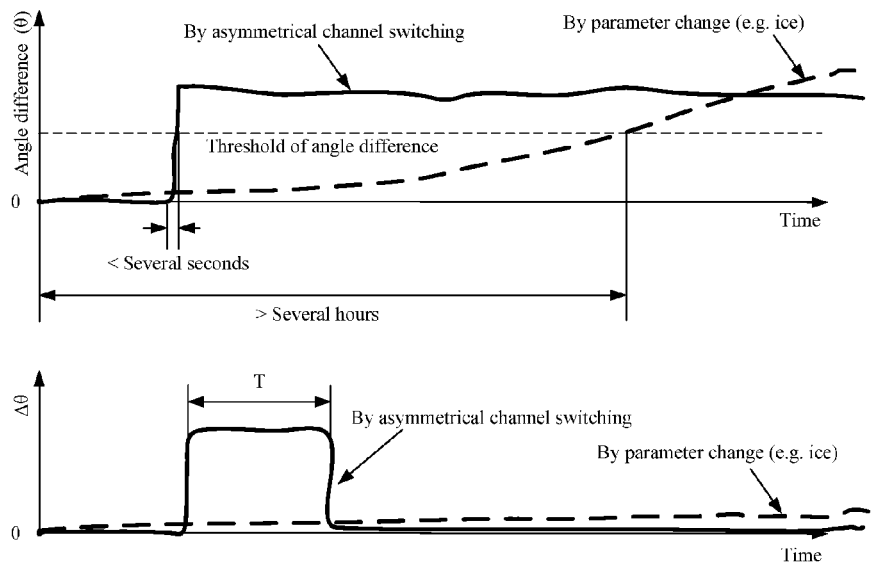
FIG. 10B shows the method for distinguishing the ice-coating from asymmetrical channel switching.

And the calculation result for the case in FIG. 10A is shown in FIG. 10B FIG. 10B which shows the method for distinguishing the ice-coating from asymmetrical channel switching. The angle differences by channel switching (thick solid line) and parameter change (thick dotted line) have obvious difference and are easy to be distinguished.

As shown in FIG. 10B, if it's the case of asymmetrical channel switching, there will be an obvious step wave of Δθ (thick solid line). In contrast, if it's the case of ice-coating, the curve of Δθ is almost zero (thick dotted line). This method is easy to be implemented and its sensitivity is excellent.

Post-Fault Embodiment

According to the other preferred embodiment, the current and voltage of each of the terminals are measured before a fault. A post fault power system can be expressed as the superposition of a superimposed fault power system on the pre-fault power system. The superimposed fault power system may be divided into positive-, negative-, and zero-sequence fault components network. These three networks are similar in configuration, while their parameters are different.

Figure 11A:
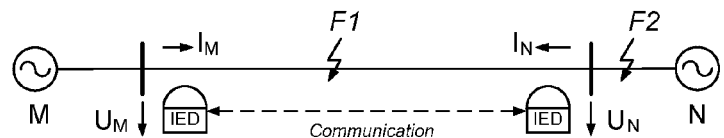
FIG. 11A shows a typical transmission system with fault.
Figure 11B:
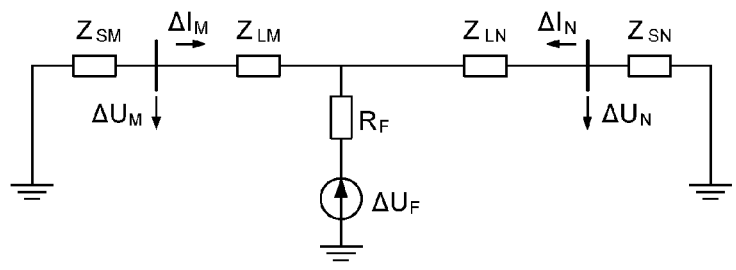
FIG. 11B is the sequence fault component network for an internal fault.
Figure 11C:
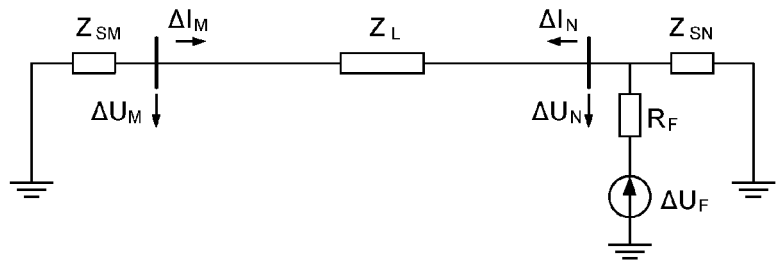
FIG. 11C is the sequence fault component network for an external fault.

FIG. 11A shows a typical 2-terminal transmission system and the transmission line is protected with current differential protection. FIG. 11B shows its sequence fault component network for an internal fault F1, while FIG. 11C shows its sequence fault component network for an external fault F2. $\Delta U$ and $\Delta I$ are the measured sequence fault components (positive-, negative-, and zero-sequence) by the IEDs. $Z_{SM}$ and $Z_{SN}$ are the source impedances of M side and N side systems. $Z_{LM}$ and $Z_{LN}$ are the line impedances at M side and N side of the internal fault point F1. $Z_L$ is the total line impedance.

The fault components can be calculated by subtracting the pre-fault measurements (samples, or phasors) from the post-fault measurements (samples, or phasors).

As FIG. 11B shows, after an internal fault occurs, there are:

$$\Delta U_M = \Delta I_M \cdot Z_{SM}$$

$$\Delta U_N = \Delta I_N \cdot Z_{SN}$$

Assuming that the system impedances and line impedances have the same impedance angles, and omitting the distributed capacitive currents on the line, there is:

$$\angle \Delta I_M = \angle \Delta I_N$$

$$\angle Z_{SM} = \angle Z_{SN}$$

Thus the measured sequence voltage fault components at both terminals have the same phase angles:

$$\angle \Delta U_M = \angle \Delta U_N$$

As FIG. 11C shows, after an external fault occurs, there are:

$$\Delta U_M = \Delta I_M \cdot Z_{SM}$$

$$\Delta U_N = \Delta I_N \cdot (Z_{SM} + Z_L)$$

Assuming that the system impedances and line impedances have the same impedance angles, and omitting the distributed capacitive currents on the line, there is:

$$\angle (-\Delta I_M) = \angle \Delta I_N$$

$$\angle Z_{SM} = \angle (Z_{SM} + Z_L)$$

Thus the measured sequence voltage fault components at both terminals have the same phase angles:

$$\angle \Delta U_M = \angle \Delta U_N$$

It can be seen that no matter the fault is internal or external, the measured sequence voltage fault components at both terminals have the same phase angles, i.e.

$$\theta_U = \angle \Delta U_M - \angle \Delta U_N = 0°$$

It can also be seen that for an internal fault, the measured sequence current fault components at both terminals have approximately same phase angles, while for an external fault, they have approximately reverse phase angles (180 degrees difference), i.e.

$$\theta_I = \angle \Delta I_M - \angle \Delta I_N = 0° \text{ internal fault}$$

$$\theta_I = \angle \Delta I_M - \angle \Delta I_N = 180° \text{ external fault}$$

As mentioned above, when the communication delays are asymmetrical, the traditional echo method will cause error in the sampling synchronization, and the error equals to half of the difference between the send and receive delays. Correspondingly, the phase relationships between the sequence voltage / current fault components will deviate from the above concluded relationships. The phase relationship deviation is $\Delta\theta$.

By calculating the phase relationship deviation $\Delta\theta$, the synchronization error caused by communication delay asymmetry can be compensated directly with $\Delta\theta$. Thus the phasors (currents and voltages) measured by both terminals' IEDs are synchronized.

If needed, the samples measured by both terminals' IEDs can also be synchronized by shifting the samples by $\Delta t$:

$$\Delta t = \Delta\theta/(f \cdot 360°)$$

Here f is the power frequency, e.g. 50 Hz, 60 Hz.

For example, if $\Delta\theta=27°$ and $f=50$ Hz, then $\Delta t=1.5$ ms

The proposed method is based on fault components, thus the synchronization is performed only after a fault (internal or external) occurs. A fault detector should be deployed in each IED to detect the fault, and start the synchronization process.

The above analysis is based on two-terminal differential protection. Similar analysis can performed for multi-terminal differential protection and the same conclusions can be achieved.

Implementations

Based on above basic principle, the invention can be implemented. Take two-terminal differential protection as example:

A. Based on sequence voltage
1) After a fault occurs (fault detectors at both terminals operate), perform the following steps at every samples or every given period;
2) Calculate the sequence voltage fault components;
3) Calculate the phase relationship deviation $\Delta\theta = \angle\Delta U_M - \angle\Delta U_N$;
4) Use the calculated $\Delta\theta$ to compensate the phase currents' phases by decrease the phase angles of M side current phasors by $\Delta\theta$, or increase the phase angles of N side current phasors by $\Delta\theta$;
5) Calculate the normal phase current differential relay with the compensated currents. if the tripping criteria are satisfied, trip the corresponding circuit breakers.

B. Based on sequence current
1) After a fault occurs (fault detectors at all terminals operate), perform the following steps at every samples or every given period;
2) Calculate the sequence current fault components;
3) Calculate the directional relays to determine if the fault is internal fault or external fault. if both IEDs make forward directional decision, the fault is an internal fault, otherwise, the fault is an external fault;
4) Calculate the phase relationship deviation.
   For an internal fault, $\Delta\theta = \angle\Delta I_M - \angle\Delta I_N$;
   For an external fault, $\Delta\theta = \angle\Delta I_M - \angle\Delta I_N - 180°$;
5) Use the calculated $\Delta\theta$ to compensate the phase currents' phases by decreasing the phase angles of M side current phasors by $\Delta\theta$, or increasing the phase angles of N side current phasors by $\Delta\theta$;
6) Calculate the normal phase current differential relay with the compensated currents. Trip the corresponding circuit breakers when meeting the tripping criteria.

The calculation of $\Delta\theta$ can be based on positive-, negative-, and zero-sequence fault components.

During three-phase operation, it's suggested to calculate $\Delta\theta$ use negative sequence fault components. If there is no negative sequence fault components (for symmetrical faults), it's suggested to calculate $\Delta\theta$ use positive sequence fault components.

During two-phase operation, it's suggested to calculate Δθ use positive sequence fault components.

Based the above principle, similar methods can be derived based on phase components or module components, rather than sequence components.

With the synchronization method of the present invention, current differential protection can operate reliably and correctly without mal-operation or blocking function even when the communication channel becomes asymmetrical or GPS signal becomes unreliable. It improves the reliability of protection system remarkably.

It is independent from the quantity of load current. Proposed method can work reliably in both heavy load and no load conditions.

The principle and method are simple and clear. It's easy to be implemented by the existing platforms.

The advantages of the external synchronization methods (echo method & GPS) and the proposed method complement each other.

Though the present invention has been described on the basis of some preferred embodiments, those skilled in the art should appreciate that those embodiments should by no means limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A synchronization method for current differential protection, the method comprising:
   selecting a point on a transmission line protected by a current differential protection;
   measuring a current and a voltage of each of multiple terminals of said transmission line;
   calculating a compensating voltage at a selected point respectively according to the measured current and the voltage of each of the multiple terminals;
   detecting and calculating a synchronization error by comparing all the compensating voltages.

2. The method according to claim 1, wherein said current and voltage of each of the multiple terminals are measured before a fault or after a fault.

3. The method according to claim 1, wherein said current and voltage of each of the multiple terminals are vectors or sampling values.

4. The method according to claim 1, wherein the current and the voltage of each of the multiple terminals are phase quantities or sequence quantities.

5. The method according to claim 1, wherein said point is selected from one of any points of transmission line or a T connected point of the multi-terminal transmission lines.

6. The method according to claim 5, wherein for a two-terminal transmission line, said point is selected from any points of transmission line, preferably from the middle or the end of the transmission line;
   for a three-terminal transmission line, said point is selected from one of the T connected point or an end of the transmission line;
   for a transmission line with more than three-terminals, the transmission line is divided into one of two-terminal transmission lines, three-terminal transmission lines or their combination; said points are selected according to a method of two terminal transmission line or three terminal transmission line.

7. The method according to claim 1, wherein a startup element method, echo method or improved echo method is used for a preliminary synchronization.

8. The method according to claim 1, further comprising:
   distinguishing a calculated synchronization error caused by a serious line parameter change or an asymmetrical channel switching by calculating a changing speed of a phase angle difference or a wave shift of said compensating voltage.

9. The method according to claim 2, wherein if the current and voltage of each of the multiple terminals are measured after a fault, the current and voltage are fault positive sequence components, negative sequence components, zero sequence components or a combination of some of them.

* * * * *